United States Patent
Al-Rawhani et al.

(10) Patent No.: US 11,349,042 B2
(45) Date of Patent: May 31, 2022

(54) ANODE SENSING CIRCUIT FOR SINGLE PHOTON AVALANCHE DIODES

(71) Applicant: STMicroelectronics (Research & Development) Limited, Marlow (GB)

(72) Inventors: Mohammed Al-Rawhani, Glasgow (GB); Neale Dutton, Edinburgh (GB); John Kevin Moore, Edinburgh (GB); Bruce Rae, Edinburgh (GB); Elsa Lacombe, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 135 days.

(21) Appl. No.: 16/718,762

(22) Filed: Dec. 18, 2019

(65) Prior Publication Data

US 2021/0193859 A1 Jun. 24, 2021

(51) Int. Cl.
| | |
|---|---|
| H04N 5/378 | (2011.01) |
| H01L 31/107 | (2006.01) |
| H01L 27/146 | (2006.01) |
| H01L 31/02 | (2006.01) |
| H04N 5/3745 | (2011.01) |

(52) U.S. Cl.
CPC ...... *H01L 31/107* (2013.01); *H01L 27/14612* (2013.01); *H01L 27/14643* (2013.01); *H04N 5/378* (2013.01)

(58) Field of Classification Search
CPC ............. H01L 31/107; H01L 27/14612; H01L 27/14643; H01L 31/02027; H04N 5/378; H04N 5/37455
See application file for complete search history.

(56) References Cited

U.S. PATENT DOCUMENTS

| | | | |
|---|---|---|---|
| 7,239,296 B2 | 7/2007 | Cheng et al. | |
| 8,476,730 B2 | 7/2013 | Sanfilippo et al. | |
| 8,766,164 B2 | 7/2014 | Sanfilippo et al. | |
| 9,659,980 B2 | 5/2017 | McGarvey et al. | |
| 10,217,889 B2 | 2/2019 | Dhulla et al. | |
| 10,276,610 B2 | 4/2019 | McGarvey et al. | |
| 10,295,669 B2 | 5/2019 | Deane | |
| 10,312,274 B1 | 6/2019 | Stark | |
| 10,715,756 B1* | 7/2020 | Tsai ................. | H01L 27/14643 |
| 2004/0245592 A1 | 12/2004 | Harmon et al. | |
| 2010/0123812 A1* | 5/2010 | Sekiguchi ......... | H01L 27/14609 348/308 |

(Continued)

*Primary Examiner* — Albert H Cutler
(74) *Attorney, Agent, or Firm* — Crowe & Dunlevy

(57) ABSTRACT

A pixel includes a single photon avalanche diode (SPAD) having a cathode coupled to a high voltage supply through a quenching element, with the SPAD having a capacitance at its anode formed from a deep trench isolation, with the quenching element having a sufficiently high resistance such that the capacitance is not fully charged when the SPAD is struck by an incoming photon. The pixel includes a clamp transistor configured to be controlled by a voltage clamp control signal to clamp voltage at an anode of the SPAD when the SPAD is struck by an incoming photon to be no more than a threshold clamped anode voltage, and readout circuitry coupled to receive the clamped anode voltage from the clamp transistor and to generate a pixel output therefrom. The threshold clamped anode voltage is below a maximum operating voltage rating of transistors forming the readout circuitry.

33 Claims, 7 Drawing Sheets

(56) References Cited

U.S. PATENT DOCUMENTS

| | | | |
|---|---|---|---|
| 2014/0291481 A1* | 10/2014 | Zhang | H01L 27/1463 |
| | | | 250/208.1 |
| 2015/0285625 A1* | 10/2015 | Deane | G01S 7/4816 |
| | | | 348/140 |
| 2016/0218236 A1* | 7/2016 | Dhulla | H01L 27/1443 |
| 2017/0179173 A1* | 6/2017 | Mandai | H01L 27/14643 |
| 2017/0301816 A1* | 10/2017 | Moore | H01L 31/107 |
| 2018/0058924 A1* | 3/2018 | Storm | G01J 1/0228 |
| 2019/0113385 A1* | 4/2019 | Fukuchi | H01L 27/14636 |
| 2019/0123215 A1 | 4/2019 | Stark | |
| 2019/0302242 A1* | 10/2019 | Fenigstein | H01L 31/02005 |
| 2019/0326450 A1* | 10/2019 | Iwata | H01L 27/14643 |
| 2020/0182692 A1* | 6/2020 | Lilic | G01J 1/44 |

\* cited by examiner

ANODE SENSING CIRCUIT FOR SINGLE PHOTON AVALANCHE DIODES

TECHNICAL FIELD

This application is directed to clamping circuits for single photon avalanche diodes (SPADs) that utilize low voltage control and provide for low voltage readout.

BACKGROUND

Single photon avalanche diode (SPAD) photodetectors are based on a PN junction that is reverse biased at a voltage exceeding a breakdown voltage. When a photon-generated carrier (via the internal photoelectric effect) is injected into the depletion region of the PN junction, a self-sustaining avalanche ensues, and detection of current output as a result of this avalanche can be used to indicate detection of the photon that generated the carrier.

There are challenges involved in the detection of this avalanche current, since the current pulses can produce a high voltage. This means that circuits are to be implemented to convert this high voltage resulting from the avalanche to a low voltage domain suitable for reading and control using sub 100 nm low voltage CMOS technology, so that SPAD based photodetection arrays can be utilized in time of flight ranging applications.

In general, it is desired for each SPAD pixel (which includes the SPAD itself as well as its associated readout and control circuitry) to be small in size so as to be able to provide a greater resolution per given size of a SPAD based photodetection array. Therefore, the smaller the size of the readout and control circuitry for each SPAD pixel, the smaller the size of each SPAD pixel, and consequently the greater the resolution per given size of a SPAD based photodetection array incorporating these SPAD pixels.

A sample prior art SPAD pixel 10 is shown in FIG. 1. The pixel 10 includes a SPAD D1 having its cathode coupled to a high voltage supply VHV through a quench resistance Rq and its anode coupled to the drain of an n-channel transistor T1. Transistor T1 in turn has its source coupled to the drain of an n-channel transistor T2, which has its drain coupled to ground. Transistor T1 is biased by a first control signal Ctrl1, which has a fixed voltage, while transistor T2 is biased by an alternating control signal Ctrl2.

When Ctrl2 goes high, it turns on, connecting the anode of the SPAD D1 to ground, setting the reverse bias voltage of the SPAD D1 above the breakdown voltage, while the clamp diode D2 disconnects the anode of the SPAD D1 from the VSPADOFF voltage. When an incoming photon strikes the SPAD D1, its cathode voltage will swing between the high voltage and a lower voltage, creating a current pulse that is detected by the detection module 11. The avalanche is quenched by the quench resistance Rq, resetting the SPAD D1 for the next detection. The purpose for Ctrl1 being a fixed voltage is to bias the transistor T1 so that it limits the current inrush to transistor T2 during the avalanche, protecting T2 from damage.

However, the use of the capacitor Cc, may consume an undesirable amount of area depending on the technology in which it is formed (e.g., CMOS). In addition, the capacitance value of the capacitor Cc is dependent on process and temperature, meaning that in an array of such SPAD pixels 10, the different SPADs may exhibit different responses, reducing the accuracy of results. Still further, the SPAD D1, due to the use of the detection module 11 at the cathode of D1, is larger than desired, further consuming an undesirable amount of area.

In an attempt to enable the formation of smaller pixels than the SPAD pixels 10, the above referenced drawbacks need addressing. Therefore, further development into this area is required.

SUMMARY

Disclosed herein is an array of single photon avalanche diodes (SPADs) including a plurality of pixels. Each pixel includes, at least: a SPAD; a transistor circuit coupled configured to quench an anode voltage of the SPAD when the SPAD is struck by an incoming photon and to clamp the anode voltage to be no more than a threshold clamped anode voltage; readout circuitry coupled to receive the clamped anode voltage from the transistor circuit and to generate a pixel output therefrom, wherein the threshold clamped anode voltage is below a maximum voltage rating of transistors forming the readout circuitry; and a regulation circuit configured to generate a control signal for the transistor circuits of the plurality of pixels.

The transistor circuit may include a high voltage transistor configured to clamp the anode voltage based upon the control signal.

The transistor circuit may further include a quenching element in series with the high voltage transistor.

The quenching element may further include a first low voltage transistor.

The transistor circuit may further include a second low voltage transistor coupled to the high voltage transistor and configured to selectively disable the pixel.

The regulation circuit may include a low dropout amplifier (LDO) that forces the control signal to be equal to a clamped voltage reference signal.

Also disclosed herein is a circuit including at least one pixel. The at least one pixel may include, at least: a single photon avalanche diode (SPAD) having a cathode coupled to a high voltage supply node, and an anode; a first n-channel transistor having a drain coupled to the anode of the SPAD, a source coupled to a clamped anode voltage output node, and a gate coupled to a voltage clamp control signal; a second n-channel transistor having a drain coupled to the clamped anode voltage output node, a source, and a gate coupled to a quenching voltage control signal; and a third n-channel transistor having a drain coupled to the source of the second n-channel transistor, a source coupled to ground, and a gate coupled to an enable signal; wherein the voltage clamp control signal and the quenching voltage control signal are set so as to quench an anode voltage of the SPAD when the SPAD is struck by a photon and clamp the anode voltage to be no more than a threshold clamped anode voltage, wherein the threshold clamped anode voltage is below a maximum operating voltage rating of the second and third n-channel transistors.

The first n-channel transistor may be a high-voltage transistor, and the second and third n-channel transistors may be low-voltage transistors capable of withstanding less voltage than the first n-channel transistor.

The first n-channel transistor may be an extended drain transistor, and the second and third n-channel transistors may be single layer gate oxide transistors.

An inverter may have an input coupled to the clamped anode voltage output node and an output providing an output signal, the inverter being formed from single layer gate oxide transistors.

The at least one pixel may include an array of pixels, a regulation circuit may generate the voltage clamp control signal for each pixel of the array of pixels.

The regulation circuit may include a low dropout amplifier that forces the voltage clamp control signal to be equal to a clamped voltage reference signal.

The regulation circuit may include: a first n-channel transistor having a drain coupled to a supply voltage, a source, and a gate biased by a cascode control signal; a second n-channel transistor having a drain coupled to the source of the first n-channel transistor of the regulation circuit, a source, and a gate; a third n-channel transistor having a drain coupled to the source of the second n-channel transistor of the regulation circuit, a source, and a gate coupled to the quenching voltage control signal; a fourth n-channel transistor having a drain coupled to the source of the third n-channel transistor of the regulation circuit, a source coupled to ground, and a gate coupled to the supply voltage; and an amplifier having a non-inverting terminal coupled to a clamped voltage reference signal, a non-inverting terminal coupled to the source of the second n-channel transistor of the regulation circuit, and an output coupled to a gate of the second n-channel transistor of the regulation circuit.

The second n-channel transistor of the regulation circuit may be an extended drain n-channel transistor.

Also disclosed herein is a circuit including at least one pixel. The at least one pixel may include: a single photon avalanche diode (SPAD) having a cathode coupled to a high voltage supply through a quenching element, wherein the SPAD has a capacitance at its anode formed from a deep trench isolation, wherein the quenching element has a sufficiently high resistance such that the capacitance is not fully charged when the SPAD is struck by an incoming photon; a clamp transistor configured to be controlled by a voltage clamp control signal to clamp voltage at an anode of the SPAD when the SPAD is struck by an incoming photon to be no more than a threshold clamped anode voltage; and a readout circuitry coupled to receive the clamped anode voltage from the clamp transistor and to generate a pixel output therefrom, wherein the threshold clamped anode voltage is below a maximum operating voltage rating of transistors forming the readout circuitry.

The readout circuitry may be an inverter having an input coupled to receive the clamped anode voltage from the clamp transistor.

An enable transistor may be coupled between the clamp transistor and ground, the enable transistor configured to selectively enable the circuit.

The enable transistor may be a double layer gate oxide (GO2) n-channel transistor.

The clamp transistor may be a high voltage n-channel transistor and the transistors forming the readout circuitry may be low voltage transistors.

The clamp transistor may be an extended drain double layer gate oxide (GO2) n-channel transistor.

The clamp transistor may be an extended drain double layer gate oxide (GO2) n-channel transistor. An enable transistor may be coupled to ground and a biasing transistor may be coupled between the clamp transistor and the enable transistor. The enable transistor may be a single layer gate oxide (GO1) n-channel transistor. The biasing transistor may be a single layer gate oxide (GO1) n-channel transistor. The transistors forming the readout circuitry may be low voltage transistors.

The at least one pixel may be an array of pixels, and a regulation circuit may generate the voltage clamp control signal for each pixel of the array of pixels.

The regulation circuit may be a low dropout amplifier that forces the voltage clamp control signal to be equal to a clamped voltage reference signal.

The regulation circuit may include, at least: a first n-channel transistor having a drain coupled to a supply voltage, a source, and a gate biased by a cascode control signal; a second n-channel transistor having a drain coupled to the source of the first n-channel transistor of the regulation circuit, a source, and a gate; a third n-channel transistor having a drain coupled to the source of the second n-channel transistor of the regulation circuit, a source, and a gate coupled to a bias signal; a fourth n-channel transistor having a drain coupled to the source of the third n-channel transistor of the regulation circuit, a source coupled to ground, and a gate coupled to the supply voltage; and an amplifier having a non-inverting terminal coupled to a clamped voltage reference signal, a non-inverting terminal coupled to the source of the second n-channel transistor of the regulation circuit, and an output coupled to a gate of the second n-channel transistor of the regulation circuit.

The second n-channel transistor of the regulation circuit may be an extended drain n-channel transistor.

The clamp transistor may be an extended drain double layer gate oxide (GO2) n-channel transistor. An enable transistor may be coupled between the clamp transistor and ground. The enable transistor may be a single layer gate oxide (GO1) n-channel transistor.

The at least one pixel may be an array of pixels. A regulation circuit may generate the voltage clamp control signal for each pixel of the array of pixels.

The regulation circuit may be a low dropout amplifier that forces the voltage clamp control signal to be equal to a clamped voltage reference signal.

The regulation circuit may include, at least: a first n-channel transistor having a drain coupled to a supply voltage, a source, and a gate biased by a cascode control signal; a second n-channel transistor having a drain coupled to the source of the first n-channel transistor of the regulation circuit, a source, and a gate; a third n-channel transistor having a drain coupled to the source of the second n-channel transistor of the regulation circuit, a source, and a gate coupled to a bias signal; a fourth n-channel transistor having a drain coupled to the source of the third n-channel transistor of the regulation circuit, a source coupled to ground, and a gate coupled to the supply voltage; and an amplifier having a non-inverting terminal coupled to a clamped voltage reference signal, a non-inverting terminal coupled to the source of the second n-channel transistor of the regulation circuit, and an output coupled to a gate of the second n-channel transistor of the regulation circuit.

The second n-channel transistor of the regulation circuit may be an extended drain n-channel transistor.

Also disclosed herein is a method of operating a pixel. The method may include, at least: quenching a single photon avalanche diode (SPAD) from its cathode sufficiently such that a capacitance at its anode from a deep trench isolation does not fully charge when the SPAD is struck by an incoming photon; clamping a voltage at an anode of the SPAD when the SPAD is struck by an incoming photon to be no more than a threshold clamped anode voltage; and reading the clamped anode voltage using readout circuitry having a maximum operating voltage rating of less than the threshold clamped anode voltage.

The voltage at the anode of the SPAD may be clamped using an n-channel extended drain double layer gate oxide transistor.

The method may include selectively enabling the pixel using an n-channel double layer gate oxide enable transistor coupled between the extended drain double layer gate oxide transistor and ground.

BRIEF DESCRIPTION OF THE DRAWINGS

FIG. 5A is a series of graphs of the pixel of FIG. 5 in operation showing cathode voltage over time, anode voltage over time, and clamped anode voltage over time.

FIG. 5B is a series of graphs of the pixel of FIG. 5 in operation (if the quenching element Rq were removed) showing cathode voltage over time, anode voltage over time, and clamped anode voltage over time.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

To address the above drawbacks, a variety of SPAD based sensing pixels have been developed. A first embodiment is now described with reference to FIG. 2.

Figure 2:
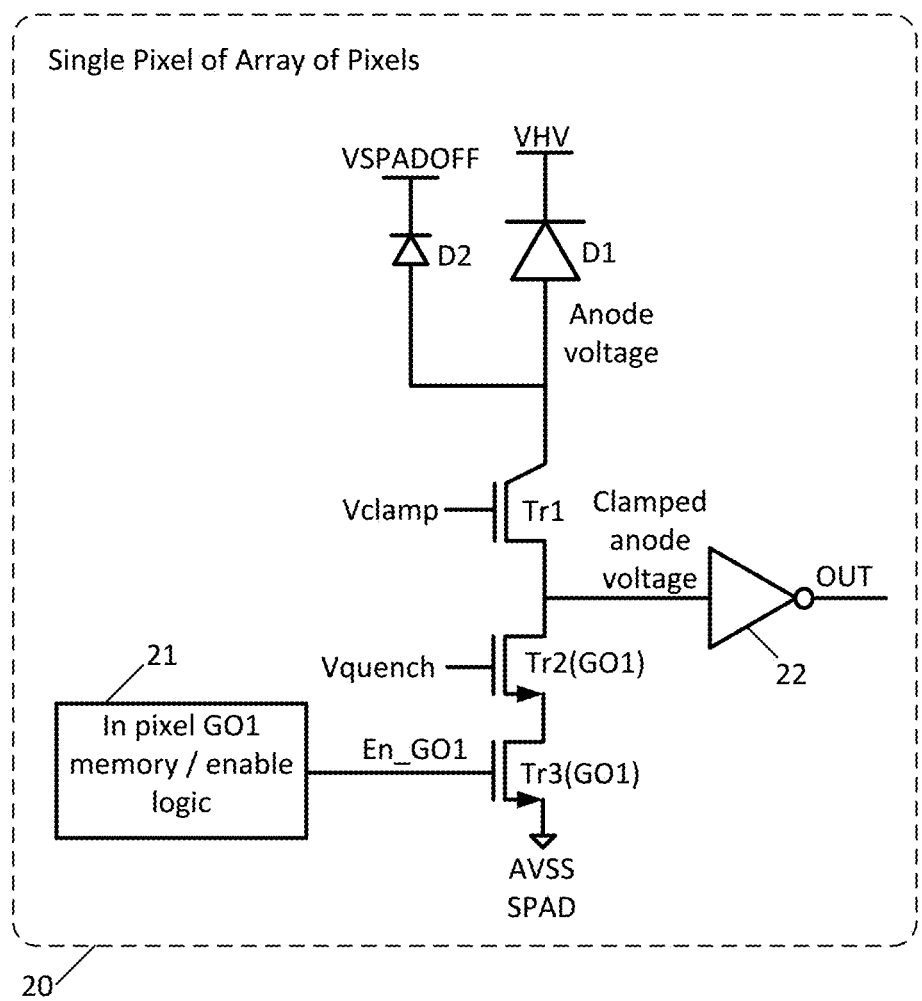
FIG. 2 is a schematic diagram of a first embodiment of SPAD based sensing pixel disclosed herein.

In FIG. 2, the pixel 20 includes a SPAD D1 having its cathode coupled to a high voltage supply VHV and its anode coupled to the drain of n-channel extended drain transistor Tr1. Transistor Tr1 has its source coupled to the drain of n-channel thin (e.g., single layer) gate oxide (GO1) transistor Tr2, and its gate biased by the Vclamp signal. Transistor Tr2 has its source coupled to the drain of n-channel single layer gate oxide (GO1) transistor Tr3 and its gate biased by the Vquench signal. Transistor Tr3 has its source coupled to voltage reference AVSS, and its gate controlled by the En_GO1 signal. The En_GO1 signal (which is the enable signal for the pixel 20) is generated by in-pixel GO1 memory/enable logic 21. A clamp diode D2 has its cathode coupled to a VSPADOFF voltage and its anode coupled to the anode of the SPAD D1. The voltage at the drain of transistor Tr2 is, as will be explained, the clamped anode voltage of the SPAD D1, and passed through an inverter 22 also implemented in GO1 technology to provide the output signal OUT.

Figure 1:
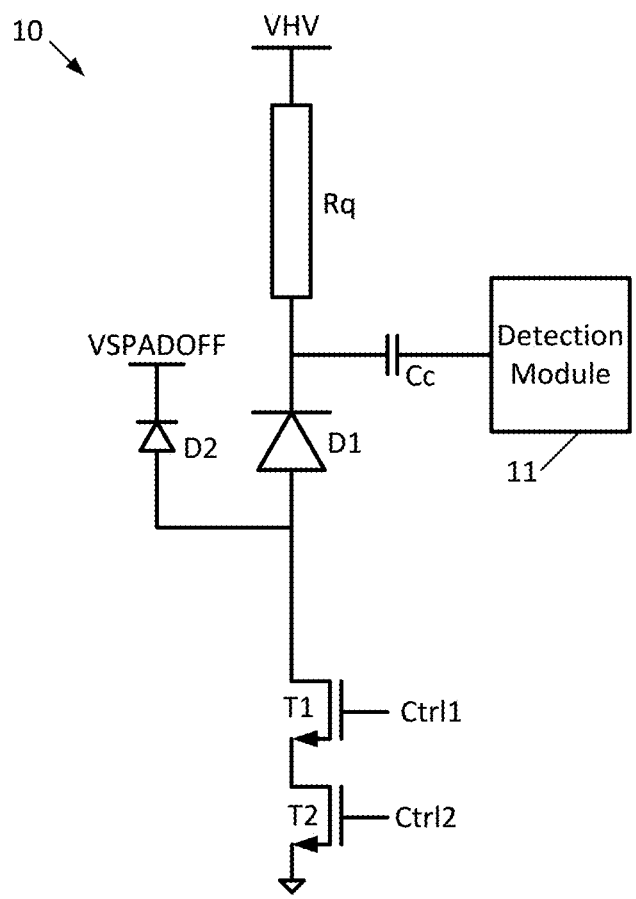
FIG. 1 is a schematic diagram of a prior art SPAD based sensing pixel.
Figure 3:
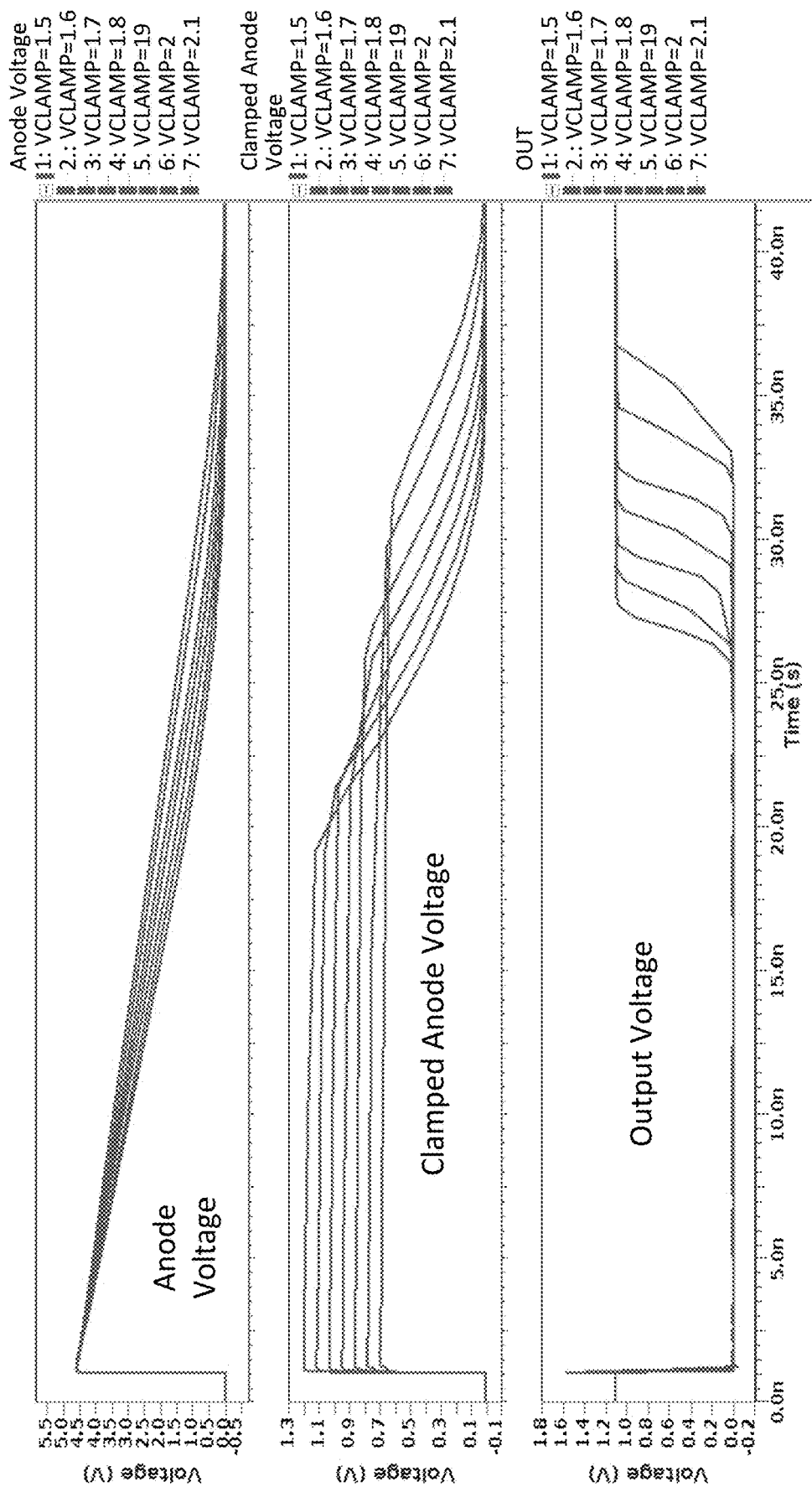
FIG. 3 is a series of graphs of the pixel of FIG. 2 in operation showing anode voltage over time, clamped anode voltage over time, and output voltage over time.

In operation, transistors Tr1 and Tr2, as biased by Vclamp and Vquench, have a resistance similar to that of the quenching element Rq present at the cathode of the SPAD Sp of the prior art design of FIG. 1. When an incoming photon strikes the SPAD D1, the anode swing will be between 0 and an excess voltage Vex of about 5 V, as seen in the anode voltage graph of FIG. 3. The n-channel extended drain transistor Tr1 is capable of withstanding higher voltages (e.g., 7 V), so the swing at the anode of the SPAD D1 does not present an issue to transistor Tr1. Using transistor Tr1 as a clamping element, for example by biasing its gate with a Vclamp of 2.5 V, the voltage at the source (the clamped anode voltage) will be in the range of 1.1 V or less, as seen in the clamped anode voltage graph of FIG. 3, enabling the use of the low voltage GO1 transistors Tr2 and Tr3, which can tolerate no more than about 1.2 V.

By changing the value of Vquench, the drain to source resistance of Tr2 changes, and therefore the quench resistance seen by the anode of the SPAD D1 will change, and thus the pulse dead time will change. By changing the value of Vclamp, the clamped anode voltage can be changed. Note that even when the anode voltage is clamped to around 0.55 V, the GO1 based inverter 22 is still able to trigger, as can be seen in the output voltage graph of FIG. 3.

Since Tr2 is a low voltage GO1 transistor, this pixel 20 has the advantage of being able to use a low voltage GO1 transistor Tr3 for enabling the pixel 20. Note that GO1 type transistors consume a small amount of area, and that the use of discrete resistors and capacitors are also eliminated, so this pixel design saves area over prior art pixel designs.

Figure 4:
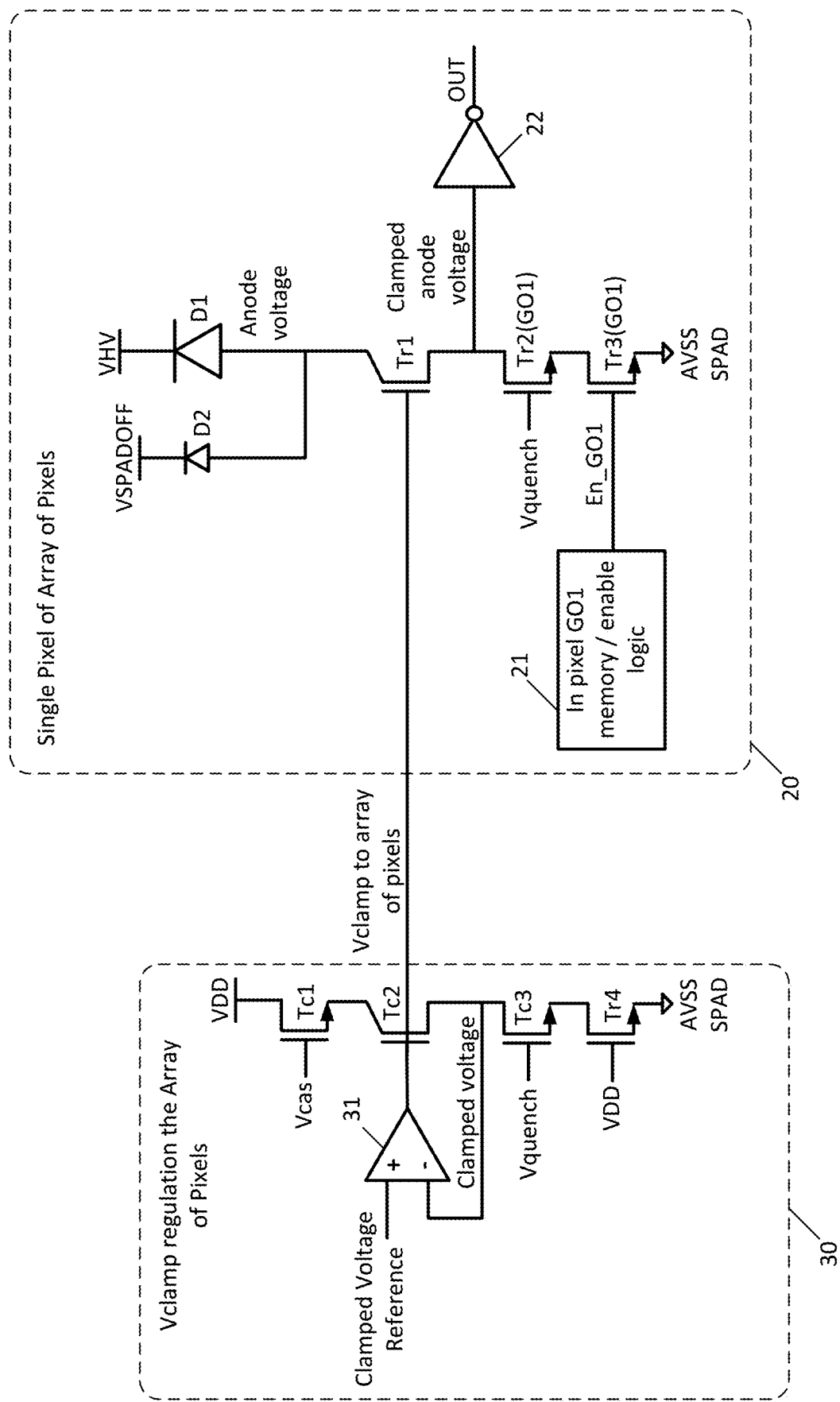
FIG. 4 is a schematic diagram showing the Vclamp regulation circuit used to provide the Vclamp voltage to the pixel of FIG. 2.

Note that the pixel 20 design described above is for a single pixel within an array of pixels. As seen in FIG. 4, a regulation circuit 30 generates Vclamp for the array of pixels (meaning that the regulation circuit 30 generates a single value of Vclamp that is passed to each pixel within the array of pixels).

The regulation circuit 30 is comprised of n-channel transistor Tc1 having its drain coupled to the power supply VDD, its source coupled to the drain of extended drain n-channel transistor Tc2, and its gate biased by the Vcas signal. The n-channel transistor Tc2 has its source coupled to the drain of n-channel transistor Tc3 and its gate coupled to the output of amplifier 31. The n-channel transistor Tc3 has its source coupled to the drain of n-channel transistor Tr4 and its gate biased by the Vquench signal (which may or may not be the same Vquench signal as received by the transistors Tr2 of the pixels 20). The n-channel transistor Tr4 has its source coupled to AVSS and its gate tied to VDD to maintain Tr4 in an on-state. Note that the source of transistor Tc2 is coupled to the inverting terminal of the amplifier 31, and that the amplifier 31 receives a clamped voltage reference at its non-inverting terminal, essentially forming a low dropout (LDO) amplifier that operates to have Vclamp match the clamped voltage reference input to the amplifier 31.

A second embodiment is now described with reference to FIGS. 5, 5A, and 5B.

Figure 5:
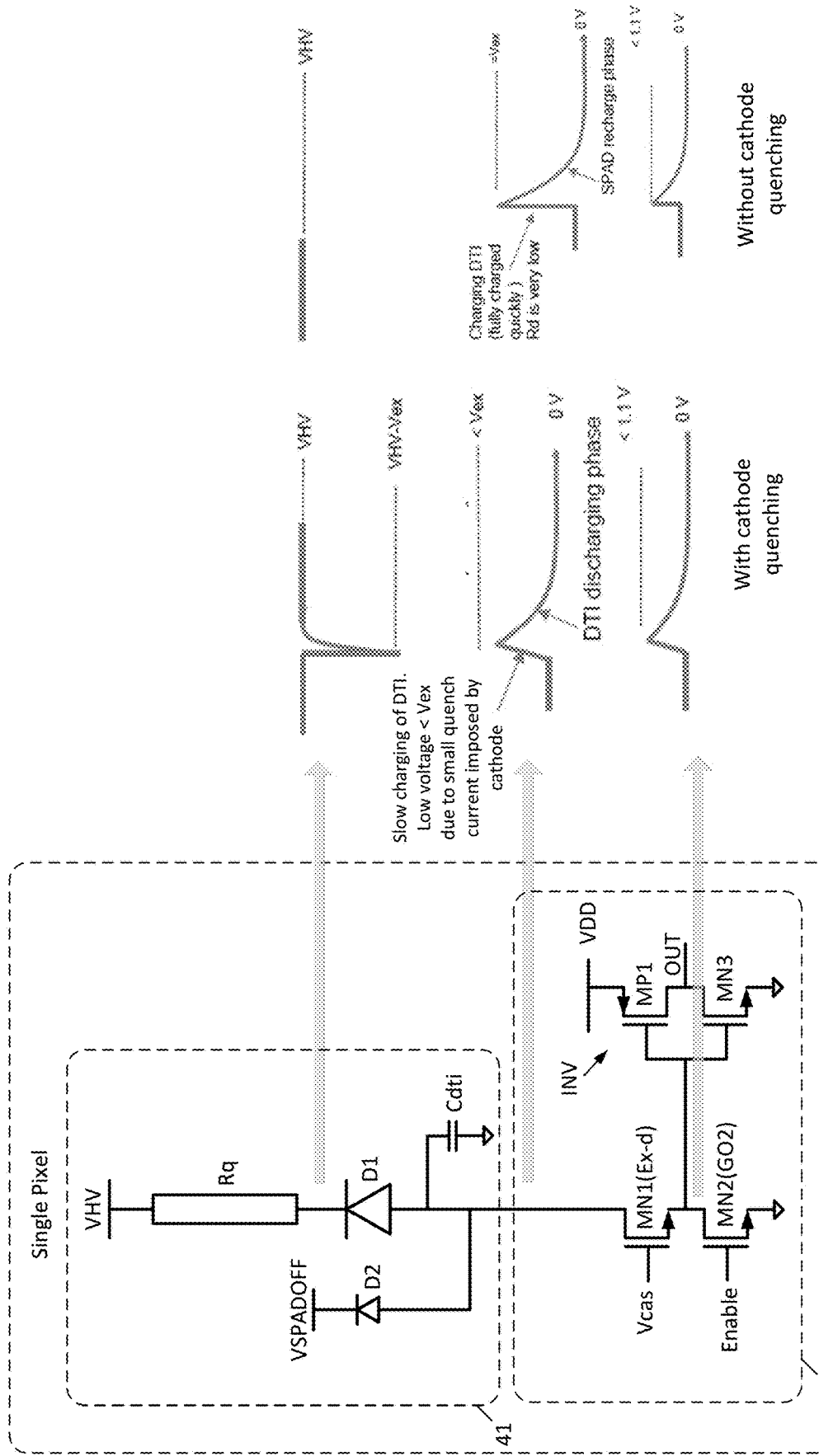
FIG. 5 is a schematic diagram of a second embodiment of SPAD based sensing pixel disclosed herein.

In FIG. 5, the pixel 40 includes a top tier chip 41 and a bottom tier chip 42; this is a stacked die solution where the top die includes the circuitry in box 41 and the bottom die includes the circuitry in box 42. The top tier chip 41 is now described and includes a SPAD D1 having its cathode coupled to a high voltage supply VHV through a quenching resistance Rq and its anode coupled to ground through a deep trench isolation parasitic capacitance Cdti that results from the fact that the SPAD D1 is formed using three dimensional SPAD technology in which different SPADs are separated from one another by deep trench isolations. A clamp diode D2 has its cathode coupled to a VSPADOFF voltage and its anode coupled to the anode of the SPAD D1.

The bottom tier chip 42 is now described and includes an n-channel extended drain double layer gate oxide (GO2) transistor MN1 having its drain coupled to the anode of the SPAD D1. Transistor MN1 has its source coupled to the drain of n-channel double layer gate oxide (GO2) transistor MN2, and its gate biased by the Vcas signal. Transistor MN2 has its source coupled to ground and its gate biased by the Enable signal (which is the enable signal for the pixel 40, and is generated by an in-pixel GO2 memory/enable logic which is not shown in FIG. 5 for simplicity). The input to an inverter INV is coupled to the drain of MN1 and the output OUT is of the pixel 40 is provided at the output of the inverter INV. The inverter INV is comprised of low voltage p-channel transistor MP1 having its drain coupled to a supply voltage VDD, its source coupled to the output OUT, and its gate coupled to the gate of low voltage n-channel transistor MN3. Low voltage n-channel transistor MN3 has its drain coupled to the output OUT, its source coupled to ground, and its gate coupled to the gate of the p-channel transistor MP1.

In operation, when an incoming photon strikes the SPAD D1, the large quenching resistance Rq quickly quenches the current through the SPAD D1 without having to charge any parasitic capacitor element at the cathode, so that the cathode voltage of the SPAD D1 quickly falls from VHV to VHV less an excess voltage Vex before recharging, as can be seen in FIG. 5A. This quick quenching process during avalanche means that the current through the SPAD D1 is low and only sufficient to slowly charge the capacitance Cdti to a level (i.e. 2 V) where it is able to trigger the inverter INV without the need to fully charge the Cdti capacitor to Vex (i.e 5V), as also seen in FIG. 5A.

The extended drain n-channel transistor MN1, properly biased by the Vcas signal, clamps the anode voltage to below 1.1 V, as seen in FIG. 5A, enabling the use of low voltage transistors MP1 and MN3 in the inverter INV for readout.

Without the quenching element Rq, the cathode voltage of the SPAD D1 would remain high during avalanche, meaning that the parasitic capacitance Cdti would be charged to Vex, increasing power consumption, as can be seen in FIG. 5B.

This embodiment combines the advantages of cathode-side quenching and anode-side reading, which reduces power consumption. This embodiment also removes the use of discrete capacitors, saving area over prior art pixel designs.

A third embodiment is now described with reference to FIG. 6.

Figure 6:
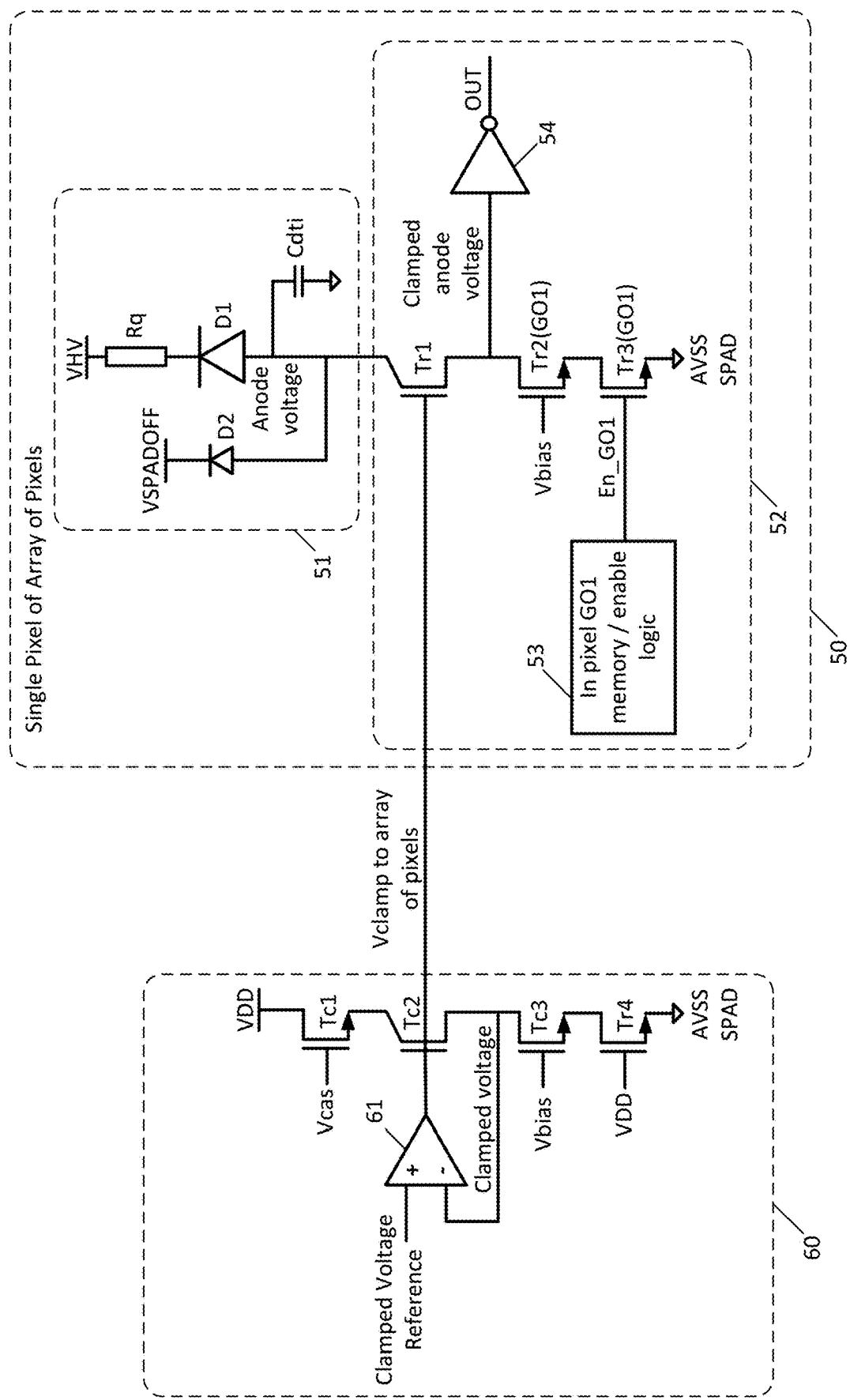
FIG. 6 is a schematic diagram of a third embodiment of a SPAD based sensing pixel and its associated Vclamp regulation circuit.

In FIG. 6, the pixel 50 includes a top tier chip 51 and a bottom tier chip 52. The top tier chip 51 is now described and includes a SPAD D1 having its cathode coupled to a high voltage supply VHV through a quenching resistance Rq and its anode coupled to ground through a parasitic deep trench isolation capacitance Cdti that results from the fact that the SPAD D1 is formed using three dimensional SPAD technology in which different SPADs are separated from one another by deep trench isolations. A clamp diode D2 has its cathode coupled to a VSPADOFF voltage and its anode coupled to the anode of the SPAD D1.

The bottom tier chip 52 is now described and includes an extended drain double layer gate oxide (GO2) n-channel transistor Tr1 having its source coupled to the drain of n-channel single layer gate oxide (GO1) transistor Tr2, and its gate biased by the Vclamp signal. Transistor Tr2 has its source coupled to the drain of n-channel single layer gate oxide (GO1) transistor Tr3 and its gate biased by the Vbias signal. Transistor Tr3 has its source coupled to voltage reference AVSS, and its gate controlled by the En_GO1 signal. The En_GO1 signal (which is the enable signal for the pixel 50) is generated by in-pixel GO1 memory/enable logic 53. The voltage at the drain of transistor Tr2 is, as will be explained, the clamped anode voltage of the SPAD D1, and passed through an inverter 54 also implemented in GO1 technology to provide the output signal OUT.

In operation, when an incoming photon strikes the SPAD D1, the large quenching resistance Rq quickly quenches the current through the SPAD D1 without having to charge any parasitic capacitor element at the cathode, so that the cathode voltage of the SPAD D1 quickly falls from VHV to VHV less an excess voltage Vex before recharging. This quick quenching process during avalanche means that the current through the SPAD D1 is low and only sufficient to slowly charge the parasitic capacitance Cdti to a level (i.e 2 V) where it is able to trigger the inverter INV without the need to fully charge the Cdti capacitor to Vex (i.e 5V).

Notice that as opposed to the first embodiment in which the transistors Tr1 and Tr2 perform quenching, here the quenching is performed at the cathode by the quenching element Rq. Therefore, here, transistor Tr1 serves to clamp the anode voltage of the SPAD D1 to a safe level for GO1 transistors forming the inverter 54, under control of the Vclamp signal. The resistance seen by the anode of the SPAD D1 can be tuned by adjusting the Vbias signal, allowing for fine tuning of the clamped anode voltage.

This embodiment combines the advantages of cathode-side quenching and anode-side reading, which reduces power consumption. This embodiment also removes the use of discrete capacitors, saving area over prior art pixel designs. In addition, since Tr2 is a low voltage GO1 transistor, this pixel 50 has the advantage of being able to use a low voltage GO1 transistor Tr3 for enabling the pixel 50, providing for further area savings.

Note that the pixel 50 design described above is for a single pixel within an array of pixels. The regulation circuit 60 generates Vclamp for the array of pixels (meaning that the regulation circuit 60 generates a single value of Vclamp that is passed to each pixel within the array of pixels).

The regulation circuit 60 is comprised of n-channel transistor Tc1 having its drain coupled to the power supply VDD, its source coupled to the drain of extended drain n-channel transistor Tc2, and its gate biased by the Vcas signal. The n-channel transistor Tc2 has its source coupled to the drain of n-channel transistor Tc3 and its gate coupled to the output of amplifier 61. The n-channel transistor Tc3 has its source coupled to the drain of n-channel transistor Tr4 and its gate biased by the Vbias signal (which may or may not be the same Vbias signal as received by the transistors Tr2 of the pixels 20). The n-channel transistor Tr4 has its source coupled to AVSS and its gate tied to VDD to maintain Tr4 in an on-state. Note that the source of transistor Tc2 is coupled to the inverting terminal of the amplifier 61, and that the amplifier 61 receives a clamped voltage reference at its non-inverting terminal, essentially forming a low dropout (LDO) amplifier that operates to have Vclamp match the clamped voltage reference input to the amplifier 61.

Figure 7:
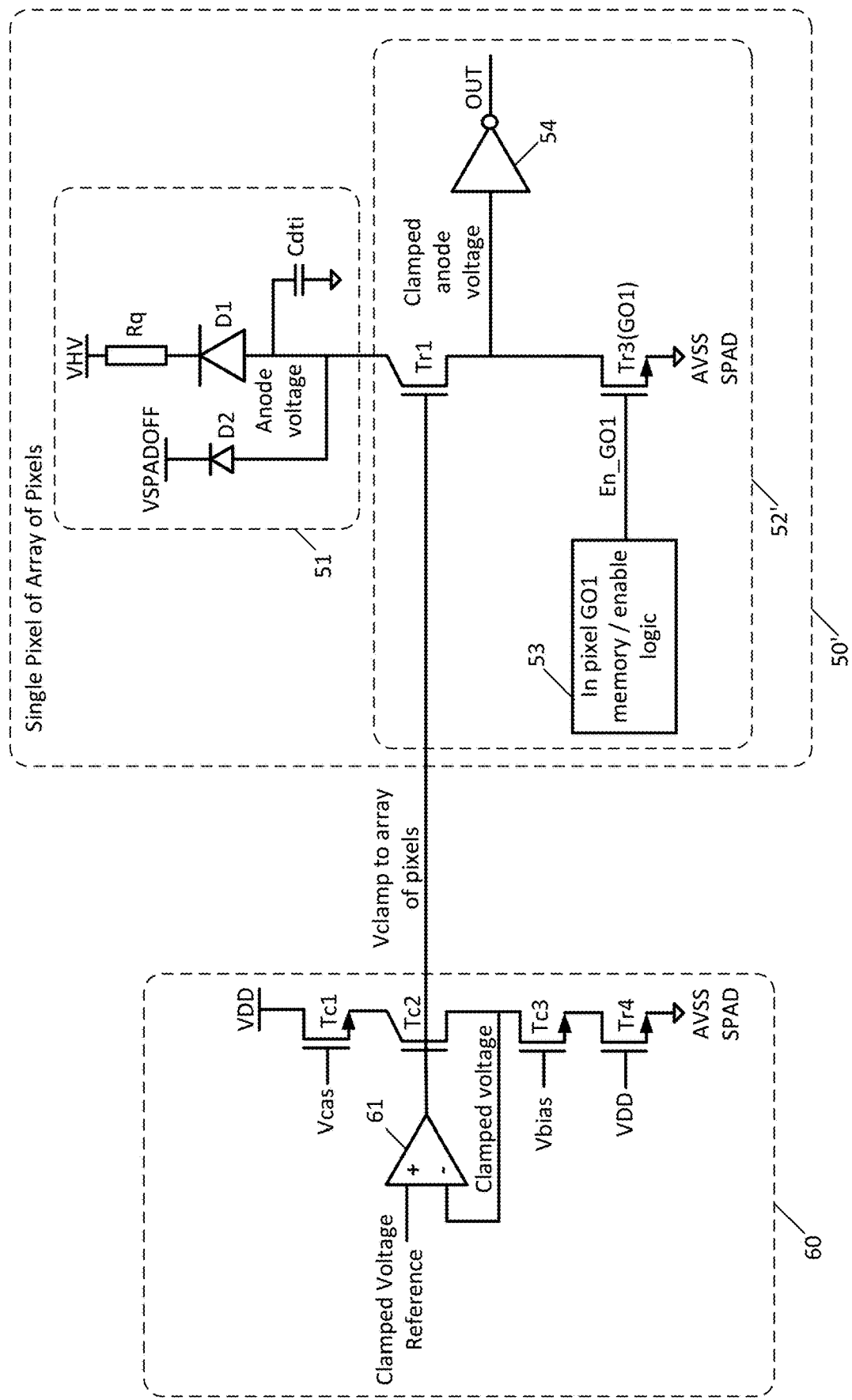
FIG. 7 is a schematic diagram of a fourth embodiment of a SPAD based sensing pixel and its associated Vclamp regulation circuit.

A fourth embodiment is now described with reference to FIG. 7. The fourth embodiment is a variant of the third embodiment where the bottom tier chip 52' of the pixel 50' lacks transistor Tr2. Instead, the source of the transistor Tr1 is coupled to the drain of transistor Tr3. Otherwise, the fourth embodiment and third embodiment are sufficiently similar that additional description need not be given for sake of brevity, although do note that by removing transistor Tr2, the fourth embodiment lacks the precise tunability of the clamped anode voltage at the third embodiment provides.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An array of single photon avalanche diodes (SPADs), comprising:
   a plurality of pixels, each pixel comprising:
      a SPAD;
      a transistor circuit coupled configured to quench an anode voltage of the SPAD when the SPAD is struck by an incoming photon and to clamp the anode voltage to be no more than a threshold clamped anode voltage; and
      readout circuitry coupled to receive the clamped anode voltage from the transistor circuit and to generate a pixel output therefrom, wherein the threshold clamped anode voltage is below a maximum voltage rating of transistors forming the readout circuitry; and
   a regulation circuit configured to generate a control signal for the transistor circuits of the plurality of pixels.

2. The array of claim 1, wherein the transistor circuit included in each pixel further comprises a high voltage transistor configured to clamp the anode voltage based upon the control signal.

3. The array of claim 2, wherein the transistor circuit included in each pixel further comprises a quenching element in series with the high voltage transistor.

4. The array of claim 3, wherein the quenching element comprises a first low voltage transistor.

5. The array of claim 3, wherein the transistor circuit included in each pixel further comprises a second low voltage transistor coupled to the high voltage transistor and configured to selectively disable that pixel.

6. The array of claim 1, wherein the regulation circuit comprises a low dropout amplifier (LDO) that forces the control signal to be equal to a clamped voltage reference signal.

7. A circuit, comprising:
   at least one pixel comprising:
      a single photon avalanche diode (SPAD) having a cathode coupled to a high voltage supply node, and an anode;
      a first n-channel transistor having a drain coupled to the anode of the SPAD, a source coupled to a clamped anode voltage output node, and a gate coupled to a voltage clamp control signal;
      a second n-channel transistor having a drain coupled to the clamped anode voltage output node, a source, and a gate coupled to a quenching voltage control signal; and
      a third n-channel transistor having a drain coupled to the source of the second n-channel transistor, a source coupled to ground, and a gate coupled to an enable signal;
   wherein the voltage clamp control signal and the quenching voltage control signal are set so as to quench an anode voltage of the SPAD when the SPAD is struck by a photon and clamp the anode voltage to be no more than a threshold clamped anode voltage, wherein the threshold clamped anode voltage is below a maximum operating voltage rating of the second and third n-channel transistors.

8. The circuit of claim 7, wherein the first n-channel transistor is a high-voltage transistor, and wherein the second and third n-channel transistors are low-voltage transistors capable of withstanding less voltage than the first n-channel transistor.

9. The circuit of claim 8, wherein the first n-channel transistor is an extended drain transistor; and wherein the second and third n-channel transistors are single layer gate oxide transistors.

10. The circuit of claim 9, further comprising an inverter having an input coupled to the clamped anode voltage output node and an output providing an output signal, the inverter being formed from single layer gate oxide transistors.

11. The circuit of claim 7, wherein the at least one pixel comprises an array of pixels; and further comprising a regulation circuit generating the voltage clamp control signal for each pixel of the array of pixels.

12. The circuit of claim 11, wherein the regulation circuit comprises a low dropout amplifier that forces the voltage clamp control signal to be equal to a clamped voltage reference signal.

13. The circuit of claim 11, wherein the regulation circuit comprises:
   a first n-channel transistor having a drain coupled to a supply voltage, a source, and a gate biased by a cascode control signal;
   a second n-channel transistor having a drain coupled to the source of the first n-channel transistor of the regulation circuit, a source, and a gate;
   a third n-channel transistor having a drain coupled to the source of the second n-channel transistor of the regulation circuit, a source, and a gate coupled to the quenching voltage control signal;
   a fourth n-channel transistor having a drain coupled to the source of the third n-channel transistor of the regulation circuit, a source coupled to ground, and a gate coupled to the supply voltage; and
   an amplifier having a non-inverting terminal coupled to a clamped voltage reference signal, a non-inverting terminal coupled to the source of the second n-channel transistor of the regulation circuit, and an output coupled to a gate of the second n-channel transistor of the regulation circuit.

14. The circuit of claim 13, wherein the second n-channel transistor of the regulation circuit is an extended drain n-channel transistor.

15. A circuit, comprising:
   at least one pixel comprising:
      a single photon avalanche diode (SPAD) having a cathode coupled to a high voltage supply through a quenching element, wherein the SPAD has a capacitance at its anode formed from a deep trench isolation, wherein the quenching element has a sufficiently high resistance such that the capacitance is not fully charged when the SPAD is struck by an incoming photon;
      a clamp transistor configured to be controlled by a voltage clamp control signal to clamp voltage at an anode of the SPAD when the SPAD is struck by an incoming photon to be no more than a threshold clamped anode voltage; and readout circuitry coupled to receive the clamped anode voltage from the clamp transistor and to generate a pixel output therefrom, wherein the threshold clamped anode voltage is below a maximum operating voltage rating of transistors forming the readout circuitry.

16. The circuit of claim 15, wherein the readout circuitry comprises an inverter having an input coupled to receive the clamped anode voltage from the clamp transistor.

17. The circuit of claim 15, further comprising an enable transistor coupled between the clamp transistor and ground, the enable transistor configured to selectively enable the circuit.

18. The circuit of claim 17, wherein the enable transistor comprises a double layer gate oxide (GO2) n-channel transistor.

19. The circuit of claim 15, wherein the clamp transistor comprises a high voltage n-channel transistor and wherein transistors forming the readout circuitry are low voltage transistors.

20. The circuit of claim 15, wherein the clamp transistor comprises an extended drain double layer gate oxide (GO2) n-channel transistor.

21. The circuit of claim 15, wherein the clamp transistor comprises an extended drain double layer gate oxide (GO2) n-channel transistor; further comprising an enable transistor coupled to ground and a biasing transistor coupled between the clamp transistor and the enable transistor; wherein the enable transistor comprises a single layer gate oxide (GO1) n-channel transistor; wherein the biasing transistor comprises a single layer gate oxide (GO1) n-channel transistor; and wherein transistors forming the readout circuitry are low voltage transistors.

22. The circuit of claim 21, wherein the at least one pixel comprises an array of pixels; and further comprising a regulation circuit generating the voltage clamp control signal for each pixel of the array of pixels.

23. The circuit of claim 22, wherein the regulation circuit comprises a low dropout amplifier that forces the voltage clamp control signal to be equal to a clamped voltage reference signal.

24. The circuit of claim 22, wherein the regulation circuit comprises:
a first n-channel transistor having a drain coupled to a supply voltage, a source, and a gate biased by a cascode control signal;
a second n-channel transistor having a drain coupled to the source of the first n-channel transistor of the regulation circuit, a source, and a gate;
a third n-channel transistor having a drain coupled to the source of the second n-channel transistor of the regulation circuit, a source, and a gate coupled to a bias signal;
a fourth n-channel transistor having a drain coupled to the source of the third n-channel transistor of the regulation circuit, a source coupled to ground, and a gate coupled to the supply voltage; and
an amplifier having a non-inverting terminal coupled to a clamped voltage reference signal, a non-inverting terminal coupled to the source of the second n-channel transistor of the regulation circuit, and an output coupled to a gate of the second n-channel transistor of the regulation circuit.

25. The circuit of claim 24, wherein the second n-channel transistor of the regulation circuit is an extended drain n-channel transistor.

26. The circuit of claim 15, wherein the clamp transistor comprises an extended drain double layer gate oxide (GO2) n-channel transistor; further comprising an enable transistor coupled between the clamp transistor and ground; and wherein the enable transistor comprises a single layer gate oxide (GO1) n-channel transistor.

27. The circuit of claim 26, wherein the at least one pixel comprises an array of pixels; and further comprising a regulation circuit generating the voltage clamp control signal for each pixel of the array of pixels.

28. The circuit of claim 27, wherein the regulation circuit comprises a low dropout amplifier that forces the voltage clamp control signal to be equal to a clamped voltage reference signal.

29. The circuit of claim 27, wherein the regulation circuit comprises:
a first n-channel transistor having a drain coupled to a supply voltage, a source, and a gate biased by a cascode control signal;
a second n-channel transistor having a drain coupled to the source of the first n-channel transistor of the regulation circuit, a source, and a gate;
a third n-channel transistor having a drain coupled to the source of the second n-channel transistor of the regulation circuit, a source, and a gate coupled to a bias signal;
a fourth n-channel transistor having a drain coupled to the source of the third n-channel transistor of the regulation circuit, a source coupled to ground, and a gate coupled to the supply voltage; and
an amplifier having a non-inverting terminal coupled to a clamped voltage reference signal, a non-inverting terminal coupled to the source of the second n-channel transistor of the regulation circuit, and an output coupled to a gate of the second n-channel transistor of the regulation circuit.

30. The circuit of claim 29, wherein the second n-channel transistor of the regulation circuit is an extended drain n-channel transistor.

31. A method of operating a pixel, the method comprising:
quenching a single photon avalanche diode (SPAD) from its cathode sufficiently such that a capacitance at its anode from a deep trench isolation does not fully charge when the SPAD is struck by an incoming photon;
clamping a voltage at an anode of the SPAD when the SPAD is struck by an incoming photon to be no more than a threshold clamped anode voltage; and
reading the clamped anode voltage using readout circuitry having a maximum operating voltage rating of less than the threshold clamped anode voltage.

32. The method of claim 31, wherein the voltage at the anode of the SPAD is clamped using an n-channel extended drain double layer gate oxide transistor.

33. The method of claim 32, further comprising selectively enabling the pixel using an n-channel double layer gate oxide enable transistor coupled between the n-channel extended drain double layer gate oxide transistor and ground.

* * * * *